(12) United States Patent
Tibi et al.

(10) Patent No.: US 7,335,865 B2
(45) Date of Patent: Feb. 26, 2008

(54) DOME

(75) Inventors: Dov Tibi, Givat Ela (IL); Tsafrir Ben-Ari, Shimshit (IL); Igal Finkelstein, Haifa (IL)

(73) Assignee: Rafael-Armament Development Authority Ltd., Haifa (IL)

( * ) Notice: Subject to any disclaimer, the term of this patent is extended or adjusted under 35 U.S.C. 154(b) by 199 days.

(21) Appl. No.: 11/152,578

(22) Filed: Jun. 14, 2005

(65) Prior Publication Data

US 2006/0138276 A1 Jun. 29, 2006

(30) Foreign Application Priority Data

Jun. 14, 2004 (IL) .................................. 162518

(51) Int. Cl.
*F42B 15/00* (2006.01)
*H01Q 1/42* (2006.01)
*F41G 7/00* (2006.01)

(52) U.S. Cl. ................... 244/3.1; 343/872; 117/1; 117/200

(58) Field of Classification Search ........ 343/872–873, 343/705, 753; 244/3.1–3.3; 117/1, 200, 117/206, 208, 209; 428/212, 218; 501/108–122; 359/350, 894
See application file for complete search history.

(56) References Cited

U.S. PATENT DOCUMENTS

| 2,748,905 | A | * | 6/1956 | Avruch ..................... 343/872 |
| 3,562,976 | A | | 2/1971 | Wollin et al. |
| 3,713,877 | A | * | 1/1973 | Kirchner .................... 428/218 |
| 3,898,051 | A | | 8/1975 | Schmid |
| 4,828,565 | A | | 5/1989 | Duthoit et al. |
| 4,930,731 | A | * | 6/1990 | Roy et al. ................. 244/3.16 |
| 5,134,518 | A | * | 7/1992 | Letter ....................... 244/3.16 |
| 5,413,973 | A | * | 5/1995 | Jantzen ..................... 501/120 |
| 5,628,154 | A | | 5/1997 | Gavette |
| 5,853,149 | A | * | 12/1998 | Vo et al. ................... 244/3.16 |
| 6,325,852 | B1 | * | 12/2001 | Theodore et al. .......... 117/209 |
| 6,424,308 | B1 | * | 7/2002 | Wu et al. .................. 343/753 |
| 6,658,800 | B2 | | 12/2003 | Monson et al. |
| 7,161,552 | B2 | * | 1/2007 | Picard et al. .............. 343/872 |
| 2002/0097190 | A1 | * | 7/2002 | Wu et al. .................. 343/872 |

* cited by examiner

*Primary Examiner*—Bernarr E. Gregory
(74) *Attorney, Agent, or Firm*—Arent Fox LLP

(57) ABSTRACT

The present invention relates to process for producing a transparent missile dome having a spanning angle larger than 180°, comprising the step of: (a) growing from single crystals of a ceramic material a first dome portion, said first dome portion being a portion of a sphere (b) growing from single crystals of a ceramic material a second dome portion, said second dome portion being a complementary sphere-portion for said first dome portion (c) attaching said complementary dome portion to said first dome portion and to the body of the missile, thereby forming a missile with a front dome having a spanning angle larger than 180°.

4 Claims, 4 Drawing Sheets

DOME

CROSS-REFERENCE TO RELATED APPLICATION

This application claims priority under 35 U.S.C. §119 to Israeli Patent Application No. 162518 filed Jun. 14, 2004, the entire specification claims and drawings of which are incorporated herewith by reference.

FIELD OF THE INVENTION

The present invention relates to a transparent dome for a flying object, such as a missile. More particularly, the present invention relates to a method for producing a dome spanning a large portion of a sphere.

BACKGROUND OF THE INVENTION

Guided flying objects, such as missiles, are generally provided with a transparent dome at their front. Behind this dome, and within the body of the missile, an optical sensing unit is provided for capturing images, and conveying them to a guiding system, which in turn guides the missile to an object or point within the captured images. The dome is generally made of a transparent material which can sustain the aerodynamic and thermal stresses that may be applied on it during the missile flight. In many conventional applications the dome is made of Sapphire.

It is known in the art that the size of the field of regard that can be obtained by the optical sensing unit depends on the spanning angle of the dome used. The term "spanning angle" when used herein refers to the actual angular portion that the dome spans with respect to a full sphere whose spanning angle is 360°. Conventional, prior art domes for missiles are made of at most half a sphere size. Therefore, when a conventional optical sensing unit is provided at the center of dome, and if it is mounted on two-axes gimbals, this optical sensing unit of the prior art can theoretically view a field of regard of at most 180°. Although it is known that the size of the field of regard depends on the spanning angle of the dome, domes spanning more than half a sphere (180°) are generally not in use. This is so, mainly due to technological obstacles in producing Sapphire domes with large spanning angles and with the required characteristics. More particularly, production of a Sapphire dome having a spanning angle substantially larger than 180°, if at all possible, is a very expensive and complicated task.

As said, the maximal active field of operation of a guided missile is limited to within the field of regard. In order to increase the filed of operation of a guided missile, it is therefore necessary to increase its field of regard, which in turn depends on the spanning angle of the dome.

It is an object of the present invention to provide a Sapphire dome having a large spanning angle, larger than 180°.

It is another object of the invention to provide said Sapphire dome with large spanning angle, while maintaining the characteristics required for operation by the missile.

It is still another object of the invention to provide a low cost and simple method for producing a Sapphire dome having a spanning angle larger than 180°.

Other objects and advantages of the present invention will become apparent as the description proceeds.

SUMMARY OF THE INVENTION

The present invention relates to a process for producing a transparent missile dome having a spanning angle larger than 180°, which comprises the step of: (a) Growing from single crystals of a ceramic material a first dome portion, said first portion being a portion of a sphere; (b) Growing from single crystals of a ceramic material a second, dome portion, said second portion being a complementary sphere-portion for said first dome portion; (c) Attaching said complementary dome portion to said first dome portion and to the body of the missile, thereby forming a missile with a front dome having a spanning angle larger than 180°.

Preferably, the dome ceramic material is Sapphire.

Preferably, in step c above of the process of the invention, the second, complementary dome portion is first attached by means of brazing to either the missile body, or to the first dome portion, whichever requires a higher brazing temperature, and then to the other of the latter two elements, attachment to which requires a lower brazing temperature.

The present invention also relates to a partial sphere dome for a missile having a spanning angle larger than 180°, which is made of two portions: (a) a first sphere dome portion having a spanning angle less than 180° and made by a process of growing single crystals; and (b) a second partial sphere dome portion made by a process of growing single crystals, said second dome portion being a complementary portion to said first portion, and also having a spanning angle less than 180°; wherein said second portion is attached to said first portion and to the missile body by means of a brazing process.

Other features and advantages of the present invention will become apparent from the following description of the invention which refers to the accompanying drawings.

DETAILED DESCRIPTION

Figure 1:
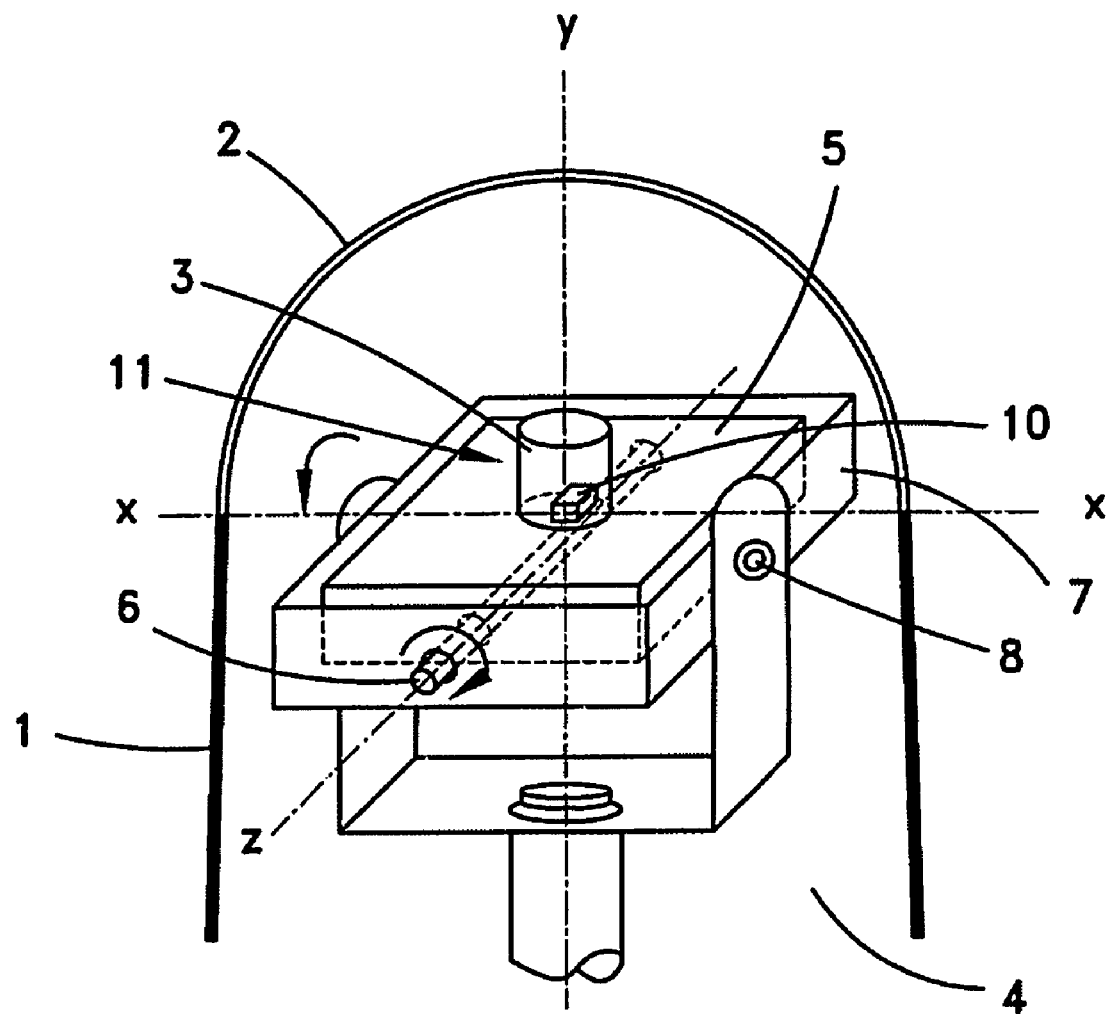
FIG. 1 shows a missile with a dome having a spanning angle less than 180°, according to the prior art.

A front section of a missile, according to the prior art, is shown in a general, schematic form in FIG. 1. For the sake of brevity, there are shown only the main elements, that are important for the understanding of the description, and they are shown not to their real scale. Those elements which are not necessary for the illustration purposes of this invention are omitted. A transparent window 2, in a form of a dome is attached to the body 1 of the missile. As said, the dome 2 according to the prior art spans at most a half-sphere, i.e., 180°, and typically 130°-180° of a sphere. An optical unit 11 which generally comprises optics 3 and a sensing element such as focal plane array 10, is mounted on internal plate 5 of gimbals system 4. The gimbals system 4 comprises an internal plate 5, which is rotatable about a first axis 6 (axis z), and an external frame 7 which is rotatable, together with the said internal plate 5 about a second axis 8 (axis x). The said first and second axes are perpendicular one with respect to the other. Of course, said rotations of the plates are performed by means of a servo system (not shown). Altogether, the gimbals system 4 has two degrees of freedom, i.e., rotation about the x axis, and rotation about the y axis.

As said, the range of the field of regard of a missile significantly depends on the spanning angle of its dome.

Figure 2:
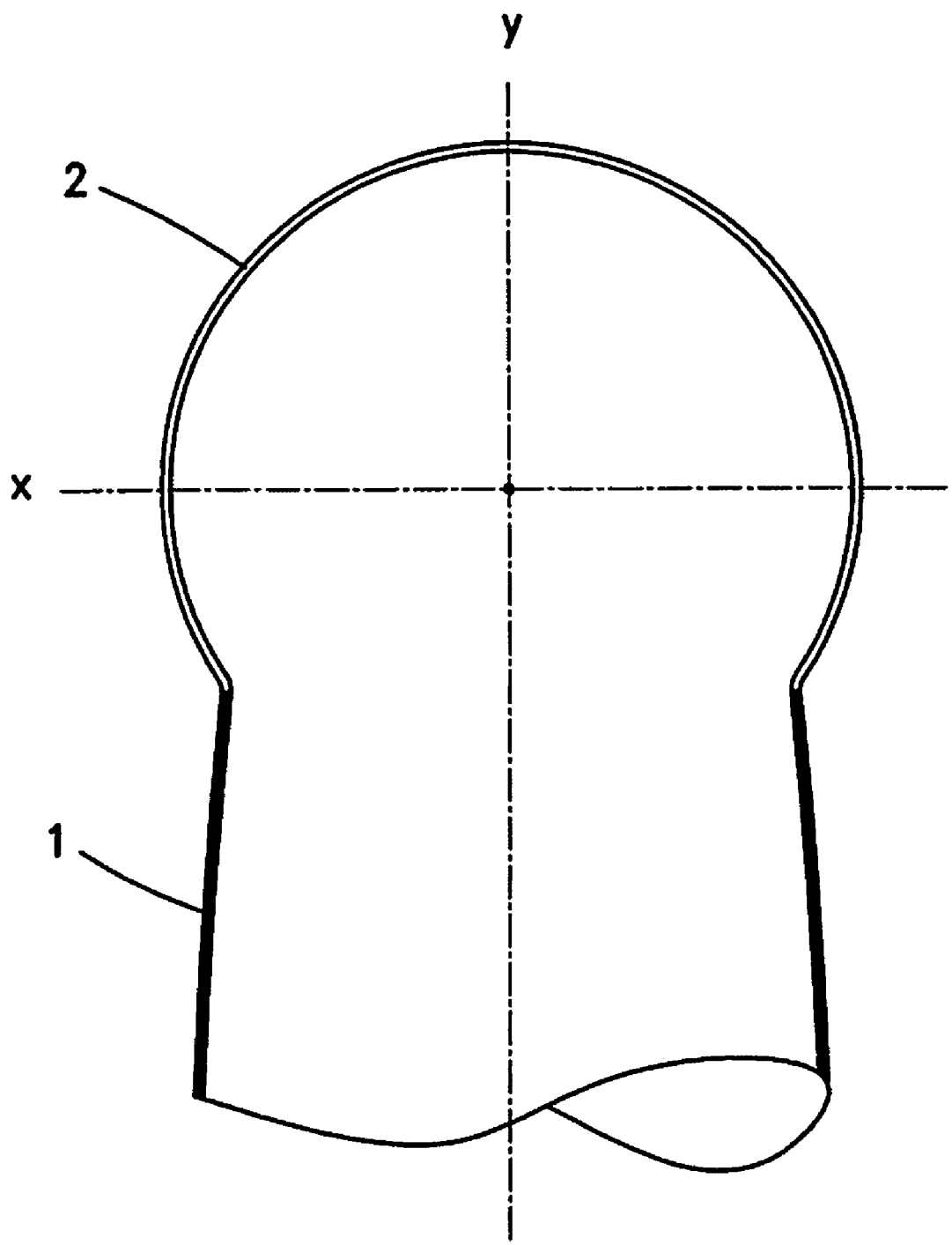
FIG. 2 shows a missile with a dome having a spanning angle larger than 180°.

FIG. 2 shows a front of a missile, with a dome having a spanning angle larger than 180°. It is known that the enlargement of the dome spanning angle increases the field of regard that can be obtained.

As said, the domes of the prior art are typically made from a transparent ceramic material, such as Sapphire. Sapphire domes are generally produced in a process of growing single crystals. In the process, the material is placed in a crucible, which is heated to above the melting point of the material, and thereafter the melted material is solidified by extracting heat from the crucible. Such a process for producing Sapphire domes is described, for example, in U.S. Pat. No. 3,898,051.

It is well known that the production of a Sapphire dome having a spanning angle larger than 180° (such as the one shown in FIG. 2) in a growing process such as the one described in U.S. Pat. No. 3,898,051 is very complicated and expensive. The present invention shows a low-cost, simple, and efficient process for producing such a dome having a spanning angle larger than 180°, and for attaching it to the front of a missile.

Figure 3:
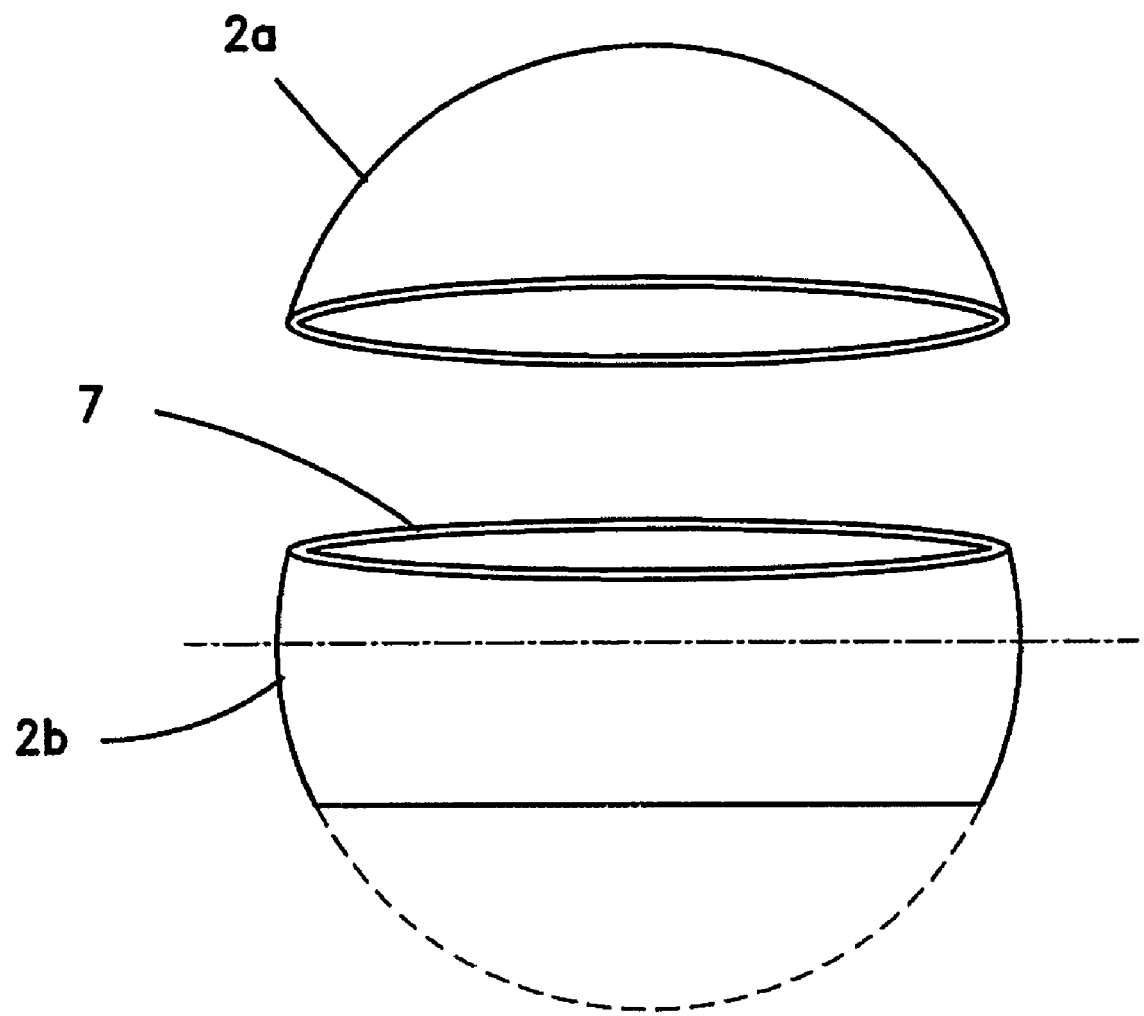
FIG. 3 shows a first dome portion and a complementary dome portion, made according to the present invention.

As shown in FIG. 3, according to the present invention the dome 2 is produced from two portions, main portion 2a, and complementary portion 2b. More particularly, the main dome portion 2a, and the complementary dome portion 2b are produced separately, by a growing process as is known in the art (for example as shown in U.S. Pat. No. 3,898,051. These two portions are made as portions of a same dimension sphere, so, when connected together to a monolithic dome, they form a large portion of a sphere having a spanning angle larger than 180°.

The two dome portions are installed to the missile in two brazing steps (the brazing procedure itself is, as said, conventional). In a first brazing step, the complementary dome portion 2b is attached to the missile body 1, or to the main dome portion 2a. The appropriate first step is determined by the one brazing process among the two which requires a higher brazing temperature. For example, if brazing the complementary dome portion 2b to the missile body 1 requires the application of higher temperature than brazing complementary portion 2b to the main dome portion 2a, then complementary portion 2b will be attached to the missile body 1 first. Otherwise, complementary portion 2b will be attached to the main dome portion 2a first. Then, in a second brazing step, the process continues in completing the remaining brazing attachment (i.e., main dome portion 2a to complementary dome portion 2b, or complementary dome portion 2b to the missile) between the elements that requires the lower brazing temperature. It has been surprisingly found that such a structure can sustain the aerodynamic and thermal stresses that are applied to the missile during its flight.

Figure 4:
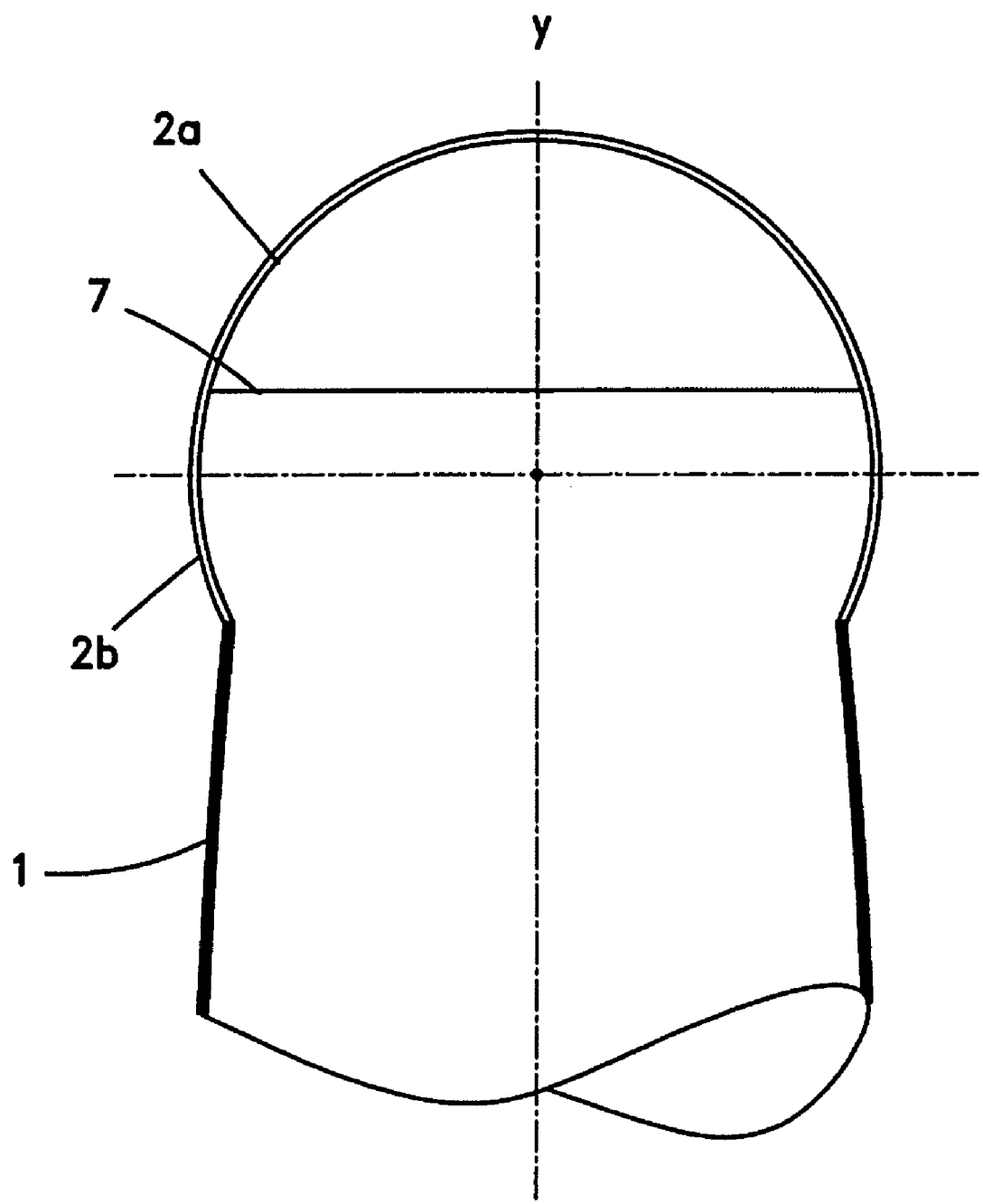
FIG. 4 shows a missile with a dome having a spanning angle larger than 180°, made according to the present invention.

FIG. 4 shows a missile having a dome attached to it according to the present invention. It can be seen that the attachment between the two dome portions 2a and 2b leaves a peripheral line 7 which is not transparent. This is, however, a very thin line, that has been found acceptable for those viewing apparatus which are installed in the missile, and which have to view through the dome.

As shown, in this manner a missile with a dome having a spanning angle larger than 180° has been produced. Therefore, by using such a dome, a field of regard larger than 180° can be obtained by an optical sensing unit positioned behind said dome. The process for preparing a dome having a spanning angle larger than 180°, as described, is much less complicated and much cheaper than the comparable process of growing single crystals. While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The present invention is not to be limited in scope by the specific embodiments described herein. Indeed, various modifications of the invention in addition to those described herein will become apparent to those skilled in the art from the foregoing description and accompanying Figures. Such modifications are intended to fall within the scope of the appended claims. Various references are cited herein, the disclosure of which are incorporated by reference in their entireties.

The invention claimed is:

1. A process for producing a transparent missile dome having a spanning angle larger than 180°, comprising:
   a. growing from single crystals of a ceramic material a first dome portion, said first dome portion being a portion of a sphere;
   b. growing from single crystals of a ceramic material a second dome portion, said second dome portion being a complementary sphere-portion for said first dome portion; and
   c. attaching said complementary dome portion to said first dome portion and to the body of the missile, thereby forming a missile with a front dome having a spanning angle larger than 180°.

2. Process according to claim 1, wherein the dome ceramic material is Sapphire.

3. Process according to claim 1 wherein in step c, the second, complementary dome portion is first attached by means of brazing to either the missile body, or to the first dome portion, whichever requires a higher brazing temperature, and then to the other of the latter two elements, attachment to which requires a lower brazing temperature.

4. A partial sphere dome for a missile having a spanning angle larger than 180°, which is made of two portions attached together:
   a. a first partial sphere dome portion having a spanning angle less than 180° and made by a process of growing single crystals;
   b. a second partial sphere dome portion made by a process of growing single crystals, said second dome portion being a complementary portion to said first portion, and also having a spanning angle less than 180°; and
   c. said second portion being attached to said first portion and to the missile body by means of a brazing process.

* * * * *